United States Patent [19]

Lagadec et al.

[11] Patent Number: 5,257,271
[45] Date of Patent: Oct. 26, 1993

[54] SAMPLE DATA TRANSMISSION APPARATUS

[75] Inventors: Roger Lagadec; Keisuke Sekiguchi; Hiroyuki Yamauchi; Masaru Tezuka; Satoru Tobita, all of Kanagawa; Yoichiro Sako, Chiba; Hiroyuki Hara, deceased, late of Kanagawa, all of Japan, by Minoru Hara, legal representative

[73] Assignee: Sony Corporation, Tokyo, Japan

[21] Appl. No.: 939,406

[22] Filed: Sep. 1, 1992

Related U.S. Application Data

[63] Continuation of Ser. No. 556,461, Jul. 24, 1990, abandoned.

[30] Foreign Application Priority Data

Jul. 29, 1989 [JP] Japan .................... 1-197341

[51] Int. Cl.$^5$ .............................................. H04L 1/14
[52] U.S. Cl. ............................... 371/37.4; 371/37.5; 371/38.1; 371/39.1
[58] Field of Search ............ 371/37.4, 37.1, 39.1, 371/38.1, 37.5, 2.2

[56] References Cited

U.S. PATENT DOCUMENTS

| | | | |
|---|---|---|---|
| 4,622,598 | 11/1986 | Doi et al. ........................ | 371/37.4 |
| 4,649,542 | 3/1987 | Noshimura et al. ............. | 371/37.4 |
| 4,742,517 | 5/1988 | Tekagi et al. .................... | 371/37.4 |
| 4,742,519 | 5/1988 | Abe et al. ........................ | 371/37.4 |
| 4,812,924 | 3/1989 | Fukami et al. .................. | 371/37.4 |
| 4,881,232 | 11/1989 | Sako et al. ...................... | 371/37.4 |
| 4,943,964 | 7/1990 | Hatanaka et al. ............... | 371/37.4 |
| 4,953,168 | 8/1990 | Odaka ............................. | 371/37.4 |
| 4,958,350 | 9/1990 | Worley et al. ................... | 371/37.4 |
| 4,975,915 | 12/1990 | Sako et al. ...................... | 371/37.4 |

OTHER PUBLICATIONS

Electronics & Wireless World, vol. 91, No. 1592, Jun. 1985, pp.80-82, J. R. Watkinson, "Channel code and disc format-2. How information is organized on the disc surface".

Primary Examiner—Robert W. Beausoliel, Jr.
Assistant Examiner—Phung Chung
Attorney, Agent, or Firm—William S. Frommer; Alvin Sinderbrand

[57] ABSTRACT

In a sampled data transmitting apparatus in which the sampled data to be transmitted are divided into odd-numbered samples and even-numbered samples and arranged in different rows of a two-dimensional data array, and in which error correction codes are annexed to each row and to each column of the two-dimensional data array, the row arraying sequence in one of the odd-numbered or even-numbered rows is caused to differ from the row arraying sequence in the other of the odd-numbered or even-numbered rows so that odd-numbered data and even-numbered data continuous with the odd-numbered data are not arranged in one row. In this manner, even when error correction becomes impossible by the error correcting code for one row, interpolation remains feasible because there exist no odd-numbered data or even-numbered data contiguous to each other in the row.

6 Claims, 6 Drawing Sheets

SAMPLE DATA TRANSMISSION APPARATUS

This application is a continuation of application Ser. No. 07/556,461, filed Jul. 24, 1990, now abandoned.

BACKGROUND OF THE INVENTION

1. Field of the Invention

This invention relates to a transmission apparatus for sampled digital, audio data and, more particularly, to a transmission apparatus for such sampled data in which the sampled data are arranged in a two-dimensional array and error correction codes are affixed in both the row direction and the column direction of the two-dimensional array before transmission of the sampled data.

2. Description of the Prior Art

When the sampled data obtained upon digitizing analog signals, such as audio or video signals, are recorded or transmitted, these sampled data frequently undergo scrambling or error correction coding. As an example of such signal processing system, there is known a so-called block-complete type product code system in which the sampled data to be transmitted are grouped into blocks each containing a predetermined number of samples, these blocks are arrayed in a two-dimensional matrix configuration and error correction codes are annexed to each row and each column of the matrix. This block-complete type product code system is superior to the so-called convolution code system in its editing performance, and is preferred as a recording format for digital audio disks for professional use or as a format for recording video signals.

It is also known that, in the case of sampled data, obtained by digitizing analog signals, such as audio or video signals, the correlation between the adjacent sampled data is so high that, when an uncorrectable error is produced, interpolation with sampled data adjacent to the sampled data in error may be resorted to effectively. Hence, for equivalently converting a burst error into a random error, scrambling is resorted to, in which adjacent data samples, that is, an odd-numbered sample and an even-numbered sample, are transmitted such that they are spaced apart from each other.

FIG. 1 shows an example of the above mentioned block complete type product code format in which sampled data $S_0$, $S_1$, $S_2$, $S_3$, ... of audio signals or the like are arrayed in a two-dimensional matrix configuration, the Q parity of the C2 code system is annexed to each row and the P parity of the C1 code system is annexed to each column. The Q parity for each row is arrayed in a column region at the horizontally central position in the drawing. In the left and right column regions, on both sides of the Q parity region, even-numbered sample data $S_0$, $S_2$, ... and odd-numbered sample data $S_1$, $S_3$, ... are arranged separately. During signal transmission, such as for recording, the sampled data are read from the extreme left column, in the vertical direction, as indicated by an arrow C, with the vertical scanning proceeding sequentially towards right in the drawing.

It will be noted that, with the above mentioned block complete type product code system, in which the sampled data to be transmitted are divided into even-numbered sampled data and odd-numbered sampled data, which are arrayed at column regions different from each other in the horizontal direction of the two-dimensional data array, the error correcting capability of a row is determined by the error correction code of the row and, if an error should occur which exceeds the error correcting capability, all of the samples of the row are determined to be uncorrectable. Since the one-row sampled data thus determined to be uncorrectable are continuous data, error concealment by the above mentioned interpolation cannot be performed satisfactorily, so that dropout may be caused in the reproduced signal. In the case of an audio signal, for example, foreign noises disagreeable to the auditory sense may be produced. In addition, if the change is acute, damage may be caused to associated apparatus or equipment.

For example, assuming that the C2 code (Q parity) shown in FIG. 1 has the capability of correcting four words, then if five or more words are in error in one row, as a result of, for example, burst errors, error correction cannot be made, such that all of the words of the row are determined to be in error. It is noted that, since the above mentioned contiguous even- and odd-numbered samples are contained in one row all words of which are determined to be in error, and these samples represent continuous data in the original signal, it is impossible to perform, for example, a mean value interpolation.

OBJECT AND SUMMARY OF THE INVENTION

In view of the above mentioned drawbacks of the prior art system, it is a principal object of the present invention to provide a sampled data transmission apparatus in which error correcting measures, such as mean value interpolation, can be taken even when the totality of words in a row of a two-dimensional data array are determined to be in error.

In accordance with the present invention, there is provided a sampled data transmitting apparatus in which the sampled data to be transmitted $S_0$, $S_1$, $S_2$, $S_3$, ... are divided into odd-numbered samples $S_1$, $S_3$, ... and even-numbered samples $S_0$, $S_2$, ... are arranged in different rows of a two-dimensional data array and in which error correction codes Q and P are generated and annexed to each row and to each column of the two-dimensional data array, respectively, thereby forming a full matrix for transmission, wherein the row arraying sequence in one of the odd-numbered or even-numbered rows is caused to differ from the row arraying sequence in the other of the odd-numbered or even-numbered rows. For example, the two adjacent rows are interchanged at the odd-number side, as shown in FIG. 1, so that even-numbered sample data and the odd-numbered sample data originally contiguous are not arranged in one and the same row.

Thus, even if all the words in a given row are determined to be in error, there exist no originally contiguous sample data in one and the same row, so that the errors do not affect contiguous data and hence mean value interpolation may be performed effectively.

DESCRIPTION OF THE PREFERRED EMBODIMENTS

Figure 2:
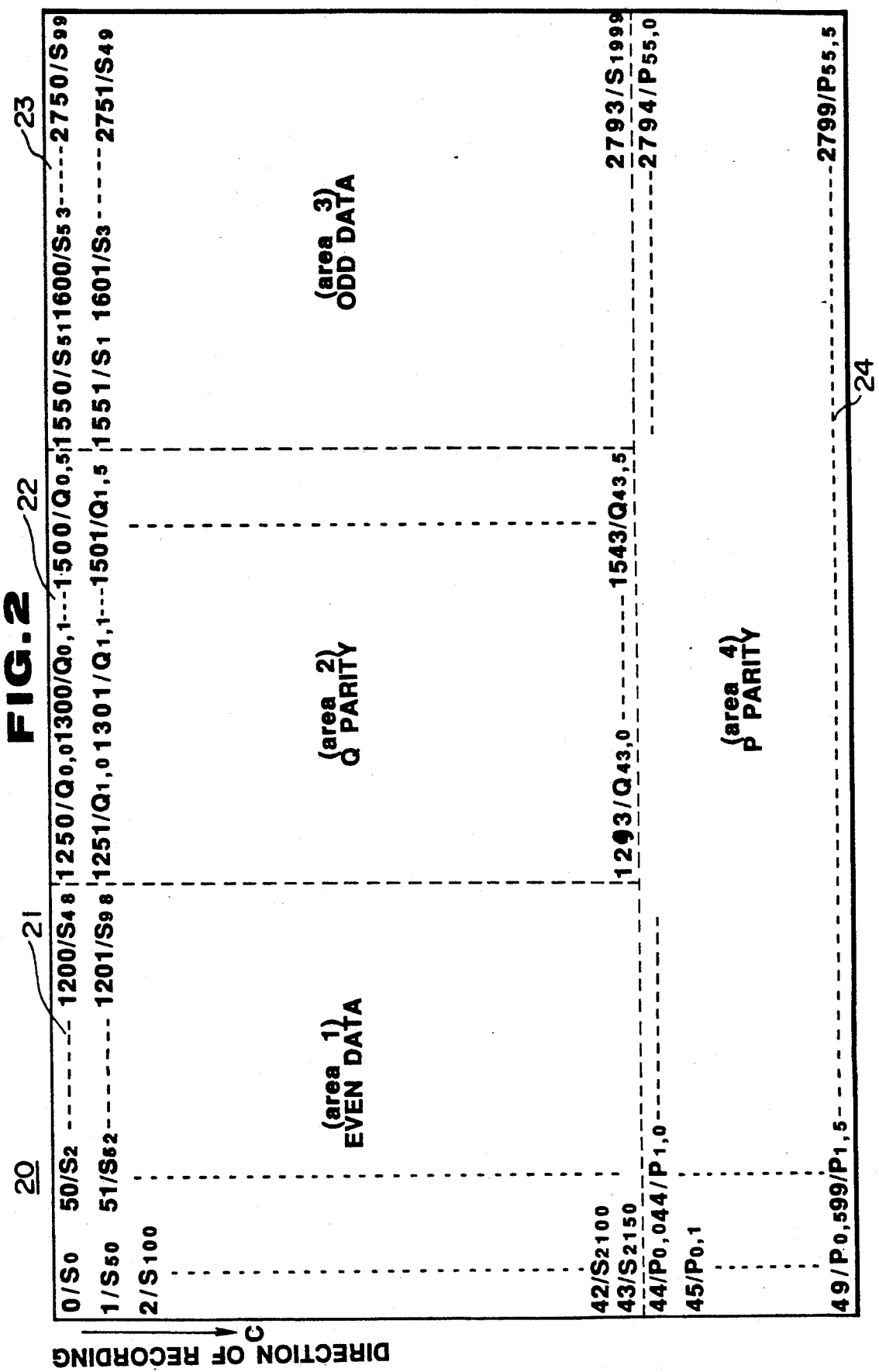
FIG. 2 shows a recording format employed in a basic embodiment of a sampled data transmitting apparatus according to the present invention.

FIG. 2 shows a recording format employed in a sampled data transmission apparatus according to a basic embodiment of the present invention.

Referring to FIG. 2, sampled data from, for example, audio signals, are grouped into blocks each including a predetermined number of samples, and are arranged in a two-dimensional data array with each data sample forming an element of the array. The Q parity code data are annexed to each row as additional row elements by C2 coding, while the P parity code data are annexed to each column as additional column elements by C1 coding. The Q parity code data elements of each row are arrayed in the central region of the row and, in different column regions on the left and right sides of the Q parity region, even-numbered sample data $S_0, S_2, \ldots$ and odd-numbered sample data $S_1, S_3, \ldots$ are arrayed in segregation from one another. In order that the mutually adjoining sampled data are not positioned in the same row, the odd-numbered sample data $S_1, S_3, \ldots$, on the right side of the Q parity region, for example, are arrayed with interchanging of the row sequences for every other row. During signal transmission, such as during recording, sampled data are read out sequentially from the left-hand column of the two-dimensional data array, in the vertical direction as indicated by the arrow C, with the scanning in the vertical direction progressing towards right sequentially.

Figure 1:
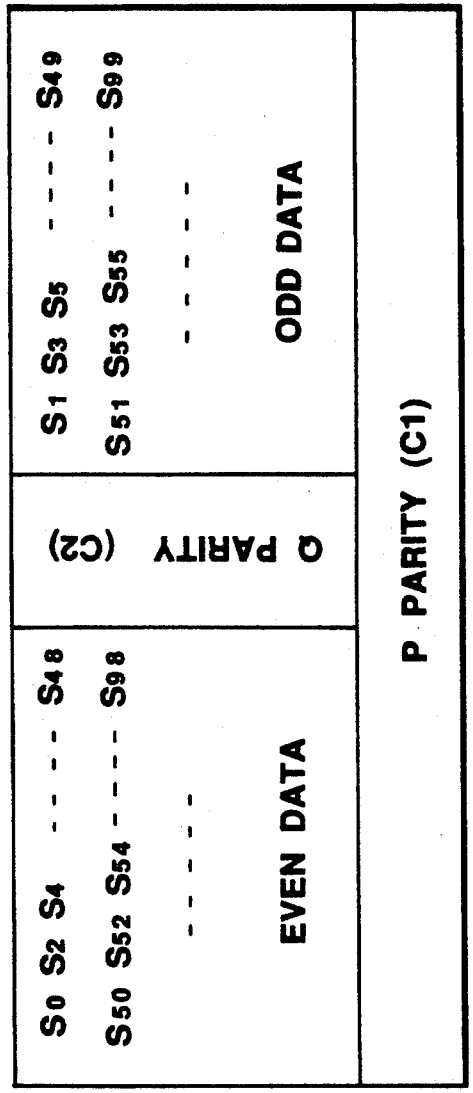
FIG. 1 shows a recording format in a conventional sampled data transmitting apparatus.

In the illustrated example, the number of samples in each row of the two-dimensional data array is 50, and 25 each of even-numbered data and odd-numbered sampled data are arrayed on the left-hand and right-hand sides of the Q parity region, respectively. The even-numbered sampled data $S_0, S_2, \ldots, S_{48}$ and the odd-numbered sampled data $S_{51}, S_{53}, \ldots, S_{99}$, which are arrayed in the first and second rows, respectively, in the data array of FIG. 1, are arrayed in the first row R1, whereas the even-numbered sampled data $S_{50}, S_{52}, \ldots, S_{98}$ and the odd-numbered sampled data $S_1, S_3, \ldots, S_{49}$, which are arrayed in the second and first rows, respectively, in the data array of FIG. 1 are arrayed in the second row R2. In this manner, every other row is interchanged in the odd-numbered sampled data region.

With the above described data array, the even-numbered sampled data $S_0, S_2, \ldots, S_{48}$ and the odd-numbered sampled data $S_{51}, S_{53}, \ldots, S_{99}$, arrayed in the first row R1, for example, are not continuous or mutually adjacent data. Therefore, after transmission, even if the number of sampled data that are in error in the first row R1 is increased beyond the error correction capability of the Q parity of the C2 system such that all of the data in the first row R1 are determined to be in error, the data in the next (second) row R2 are the continuous or mutually adjacent data with respect to aforementioned data in error, so that the errors occur at every other sample, or at a period of two samples, and hence may be effectively concealed by, for example, mean value interpolation. In other words, the probability of feasible interpolation after error occurrence is raised to protect against noise generation thus improving the quality of the reproduced signals.

Figure 3:
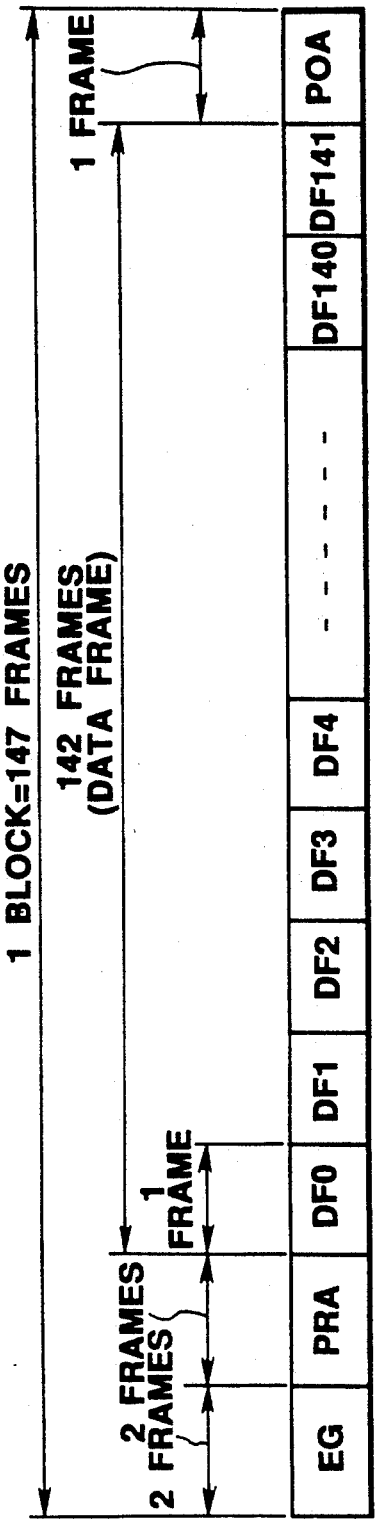
FIGS. 3 and 4 show a concrete example of a recording format applied to a digital audio recording system, FIG. 3 showing a recording data structure for one block and FIG. 4 showing a block-complete type product code format.
Figure 4:
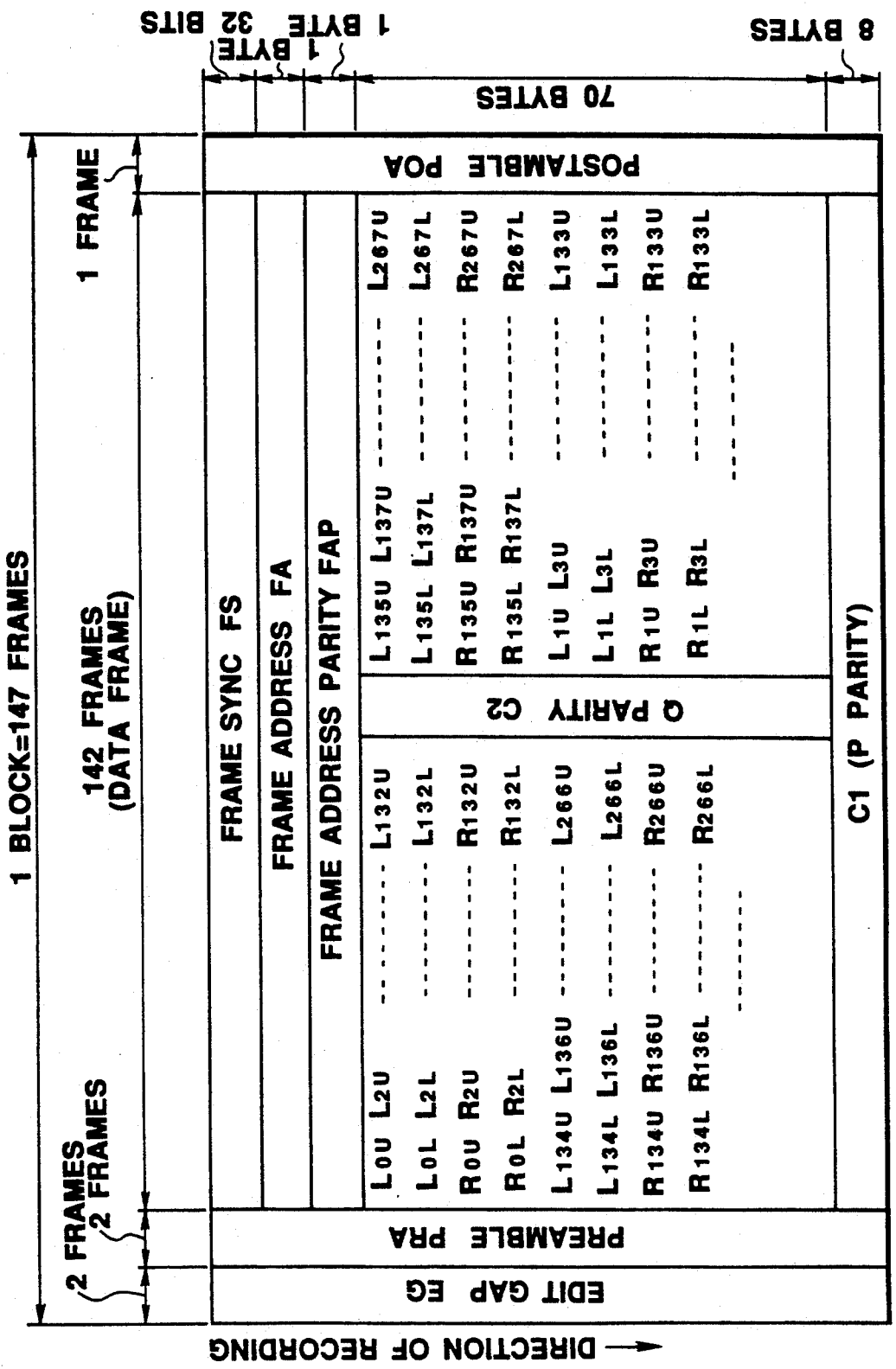

FIGS. 3 and 4 illustrate a recording format which may be preferably employed in, for example, a digital audio recording system of professional applications. FIG. 3 shows a recording data construction for one block and FIG. 4 shows a block-complete type product code format. In the present recording format, the frequency of a block and the frequency of a frame derived from a block are at integer ratios with respect to the corresponding frequencies of the so-called compact disc (CD) format now in widespread use, with a view to simplifying the interfacing structure on the structure of the clocking system for application to a so-called CD mastering system.

Referring to FIGS. 3 and 4, the sampled data to be transmitted are divided into blocks each consisting of a predetermined number of samples, with the block frequency being set so as to be at an integer ratio with respect to the block frequency of the so-called CD format of 75 Hz, such as 25 Hz, which is one-third the CD format block frequency. Each block is constituted by a predetermined number of frames, with the frame frequency being set so as to be at an integer ratio with respect to the frame frequency for the CD format of 7.35 kHZ, such as 3.675 kHz, which is one half the frame frequency for the CD format. The number of frames in each block is one of the measures 252, 147, 98, ... of 44.1 kHz, which is the sampling frequency used for analog-to-digital conversion of the input audio signal. The number of frames is set to 147, as an example. Then the frame frequency may be found from the number of the frames of 147 and the block frequency of 25 Hz by the formula $$25 \text{ blocks/sec} \times 147 \text{ frames/block} = 3.675 \text{ frames/sec.}$$

On the other hand, the frequency of the clock components of the signals modulated for transmission or recording, or the so-called channel clock frequency, is set so as to be an integer multiple of, such as 115 times, the above-mentioned sampling frequency, or 5.0715 MHz. The number of bits per sample may be 16, 20 or 24. In the following example, the number of bits per sample is 16.

Referring to FIG. 3, a 2-frame edit gap EG, a 2-frame preamble PRA, a data frame constituted by 142 frames DF0, DF1, ..., DF141, and a 1-frame postamble POA, are arrayed in this order from the leading end of a block consisting of 142 frames. Each of these frames is constituted by 79 bytes and 37 channel bits and has a two-dimensional data array in the form of a matrix as shown in FIG. 4. In FIG. 4, the data frame is constituted, starting from the leading end of each frame, of a frame sync FS formed by 37 channel bits, a frame address FA formed by 1 byte, a frame address FA formed by 1 byte, a frame address parity FAP formed by 1 byte and a C1 code or P parity formed by 8 bytes.

It will be noted that, insofar as the 70-byte data portion and the 8-byte C1 code or P parity region are concerned, 16-bit samples of the left and right stereo channels in the 142-frame region of FIG. 4 are split with 8 bits or 1 byte as a unit, and the thus split samples (8-bit samples) are arranged so that even-numbered samples and odd-numbered samples are in different rows. In FIG. 4, $L_{OU}, L_{OL}, R_{OU}$ and $R_{OL}$ represent 8-bit or 1-byte data formed by splitting the 16-bit samples into upper 8 bits and lower 8 bits. For example, $L_{OU}$ and $L_{OL}$ represent upper and lower 8 bits of the leading one of 16-bit samples of the left channel of a block, respectively.

In the example of FIG. 4, the upper and lower 8 bits of the left channel 16-bit samples and the upper and lower 8 bits of the corresponding right channel 16-bit samples are continuously arranged in four rows of a column. For example, in first to fourth rows of the first column of FIG. 4, the above mentioned 8-bit samples $L_{OU}$, $L_{OL}$, $R_{OU}$ and $R_{OL}$ are arranged sequentially. With the four-row four-byte data as one unit, the even-numbered sample data and the odd-numbered sample data are arranged in different column region in the left side 67-frame region and right side 67-frame region. Thus even-numbered sample data are arranged in the left side 67 frames or 67 columns of the 142 frames or 142 columns making up the data frame of FIG. 4. The C2 code parity or Q parity is arranged in the central 8 frames or 8 columns. The odd-numbered sample data are arranged in the right side 67 frames or 67 columns of the 142 frames or columns.

In order to avoid the situation in which continuous or mutually adjoining samples exist in the same row, the odd-numbered samples in the right side 67-frame or 67-column region are arranged with row sequence interchanging with the four rows as one unit. That is, the four adjacent rows are interchanged as a whole with the four adjacent rows that are adjacent to the firstly mentioned four adjacent rows. This interchanging may also be performed on the even-numbered samples.

The construction of an apparatus for implementing the recording format described with reference to FIG. 2 is hereinafter explained.

Figure 5:
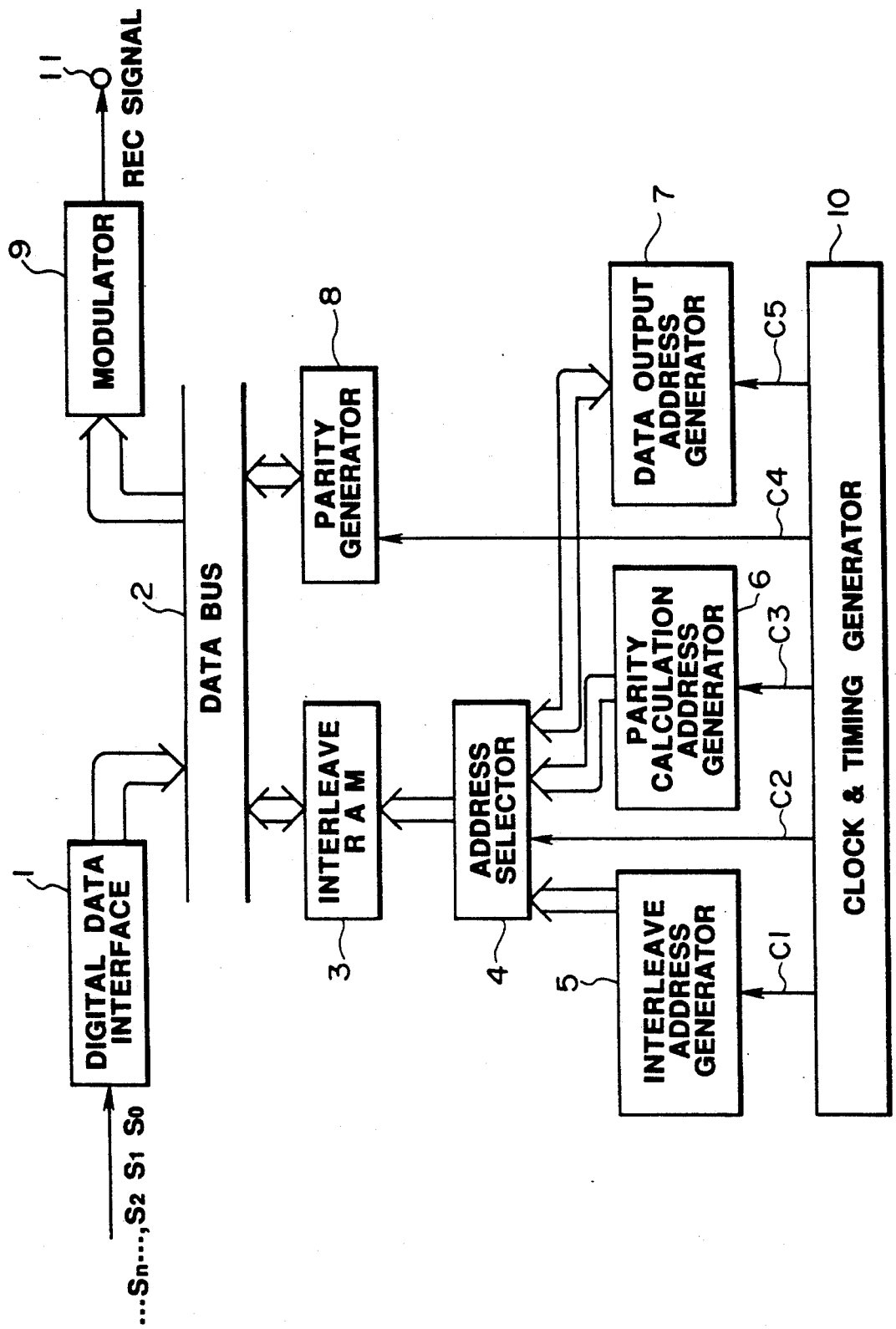
FIG. 5 is a block diagram showing essential portions of an apparatus according to an embodiment of the present invention.

FIG. 5 shows a data array controlling apparatus as a whole in a digital audio data transmission system according to the present invention. In this figure, digital audio data $S_0, S_1, S_2, \ldots, S_n$, sampled in this sequence, are input to a digital data interfacing circuit 1, and thence to an interleaving RAM 3 over data bus 2 after processing for bit reduction if necessary. Address data generated by an interleaving address generator 5 for causing the digital audio data $S_0, S_1, S_2, \ldots S_n$ to be written in accordance with the format described later is supplied by means of an address selector 4 to the interleaving RAM 3. This address selector 4 is controlled by selector control signals, supplied from a clock timing generator 10 over conductor C2 at a timing controlled by a microcomputer, not shown, to receive addresses generated by an interleaving address generator 5. The address selector is adapted to receive address data from a parity computing address generator 6 or a data outputting address generator 7. The digital audio sampled data $S_0, S_1, S_2, \ldots, S_n$ are sequentially stored at predetermined locations in RAM 3 in accordance with addresses generated by the interleaving address generator 5. FIG. 2 shows a map 20 for the interleaving RAM 3, as described above. In this figure, even-numbered data $S_0, S_2, S_4, \ldots, S_{2n}$ of the digital audio sampled data are stored in a storage area (reference numeral 21), odd-numbered data $S_1, S_3, S_5, \ldots, S_{2n+1}$ of the digital audio sampled data are stored in a storage area 3 (23), parity data or Q parity data for the horizontal data are stored in a storage area 2 (22) and parity data or P parity data for the vertical data are stored in a storage area 4 (24).

Referring to FIG. 2, on arrival of digital audio sampled data $S_0$ at RAM 3, an address data 0 is input to RAM 3 from the interleaving address generator 5 in order to cause the data $S_0$ to be stored at address 0 of the area 1 (21) of RAM 3. This state is shown by $0/S_0$. The digital audio sample data $S_1$ then is entered into RAM 3. At this time, the address data of the interleaving address generator 5 is 1551, so that the data $S_1$ is stored in a first column of a second row of the area 3 (23) of RAM 3, in order to avoid storing contiguous samples in the same row. This state is indicated by $1551/S_1$. When next the data $S_2$ is input to RAM 3, an address data 50 is generated by the interleaving address generator 5. Similarly, when the data $S_3$ is input to RAM, the address data 1601 is generated by the interleaving address generator 5. These data $S_2, S_3$ are stored in the second column of the first row of the area 1 (21) and in the second column of the second row of the area 3 (23), respectively, as indicated by $50/S_2$ and $1601/S_3$, respectively. In a similar manner, the even-numbered data and the odd-numbered data of the audio sample data are sequentially stored in the area 1 (21) and area 3 (23), respectively. After the last digital audio sampled data $S_{1999}$ of the block is stored in the 25th column of the 44th row of the area 3 (23), as indicated by $2793/S_{1999}$, a control signal generated by clock timing generator 10 shown in FIG. 5 is supplied over conductor $C_2$ to the address selector 4. This control signal causes the address selector 4 to be switched to the side of the parity computing address generator 6 for supplying the output address of the generator 6 to the interleaving RAM 3. Addressing by the parity computing address generator 6 causes the data $0/S_0, 50/S_2, \ldots, 1200/S_{48}, 1550/S_{51}, 1600/S_{53}, \ldots 2750/S_{99}$ of the first row of the areas 1 (21) and 3 (23) of the interleaving RAM 3 to be read sequentially and supplied over data bus 2 to parity generator 8. The generator 8 performs various arithmetic operations on these data $S0, S2, \ldots, S48, S51, S53, \ldots, S99$ to generate six data $Q_{0,0}, Q_{0,1}, Q_{0,2}, Q_{0,3}, Q_{0,4}$ and $Q_{0,5}$. The data $Q_{0,0}$ may for example be the result of simple addition of the sample data $S0, S2, \ldots, S51, S53, \ldots, S99$, whereas the data $Q_{0,1}$ may be the result of multiplication of the sampled data by a first weighting coefficient. Similarly, the data $Q_{0,2}, Q_{0,3}, Q_{0,4}$ and $Q_{0,5}$ may be the result of multiplication of the sampled data by a second, third, fourth and a fifth coefficients followed by summation. After formation of these parity data $Q_{0,0}, Q_{0,1}, Q_{0,2}, Q_{0,3}, Q_{0,4}$ and $Q_{0,5}$, the parity generator 8 causes these parity data $Q_{0,0}$ to $Q_{0,5}$ to be supplied over data bus 2 to the interleaving RAM 3 by a control signal supplied from the clock timing generator 10 over conductor C4. On arrival of data $Q_{0,0}$ and $Q_{0,1}$, addresses 1250 and 1300 are supplied to the interleaving RAM 3, by the parity computing address generator 6, so that these parity data $Q_{0,0}$ to $Q_{0,5}$ are stored in the first row of the storage area 2 (22) of FIG. 2 as $1250/Q_{0,0}, 1300/Q_{0,1}, \ldots, 1500/Q_{0,5}$, respectively. In a similar manner, all of the parity data $Q_{1,0}, Q_{1,1}, \ldots, Q_{1,5}, \ldots, Q_{43,0}, \ldots Q_{43,5}$ are stored in area 2 (22) of FIG. 2. In this manner, the digital audio sample data consisting of the even-numbered sample data and the odd-numbered sample data are stored in the areas 1 and 3, whereas the Q parity data are stored in the area 2. The formation and storage of the P parity data is then performed. That is, data $0, 1, 2, 3, \ldots, 43$ are sequentially generated by the parity computing address generator 6 so that data $S_0, S_{50}, S_{100}, \ldots, S_{2100}, S_{2150}$, stored in these addresses, are supplied by the interleaving RAM 3 over data bus 2 to the parity generator 8. In this manner, 44 sample data in the first column of the area 1 (21) of RAM 3 are first supplied to the parity generator 8. The generator 8 performs an arithmetic operation similar to the arithmetic operation of generating the Q parity data to generate six P parity data, that is $P_{0,0}$, $P_{0,0}$, $P_{0,1}$, $P_{0,2}$, $P_{0,3}$, $P_{0,4}$ and $P_{0,5}$ for the sample data $S_0$, $S_{50}$, ..., $S_{2150}$ in the first column of the area 1 (21). These six P parity data $P_{0,0}$ to $P_{0,5}$ are supplied from parity generator 8 over data bus 2 to the interleaving RAM 3. Since the RAM 3 is controlled at this time by the parity computing address generator 6 so as to supply address 44, 45, ..., 49 to the P parity data $P_{0,1}$, $P_{0,2}$, ..., $P_{0,5}$ as shown in FIG. 2, the parity data are stored in the first column of the area 4 (24) of FIG. 2, as indicated by $44/P_{0,0}$, $45/P_{0,1}$, ..., $49/P_{0,5}$, respectively. Thus the area 4 (24) is provided for storing the P parity data. In a similar manner, 44 sample data of the second column of area 1 (21) are selected and transmitted to the parity generator 8 to generate six P parity data $P_{1,0}$, $P_{1,1}$, $P_{1,2}$, $P_{1,3}$, $P_{1,4}$ and $P_{1,5}$ which then are stored in the second column of the area 4 (24), as indicated by $94/P_{1,0}$, ... $99/P_{1,5}$, by a process similar to that described in the foregoing. The P parity data up to $P_{55,0}$ ... $P_{55,5}$ are generated and stored in area 4 (24), by a sequence of operations similar to that described in the foregoing to complete the 1-block record data. After the data are stored in their entirely in accordance with the format shown in FIG. 2, the address selector 4 is switched from the side of the parity computing address generator 6 to the side of the data output address generator 7, under the command address information generated by the address output address generator 7 to the interleaving RAM 3. This switching sets the RAM 3 to the reading mode, while causing addresses 0 to 2799 to be sequentially designated in the RAM 3, so that the sampled data stored in RAM 3 are sequentially read from the first column to the 56th column of the RAM map shown in FIG. 2 and supplied to a modulator 9 over data bus 2. The sample data are modulated in the modulator 9 into a data format suitable for recording so as to be supplied as recording signals to an output terminal 11. In the above description, after the P parity data $P_{0,0}$ to $P_{0,5}$ are formed, these data are returned from the parity generator 8 to RAM 3 over data bus 2 and, after the sample data are stored in their entirety in RAM 3, they are supplied over data bus 2 to modulator 9. However, this is not meant to be limiting, that is, the P parity data $P_{0,0}$ to $P_{0,5}$, generated by the parity generator 8, may be directly transmitted from the parity generator 8 to the modulator 9 over data bus 2 along with the sample data $S_0$, $S_{50}$, ..., $S_{2150}$.

Figure 6:
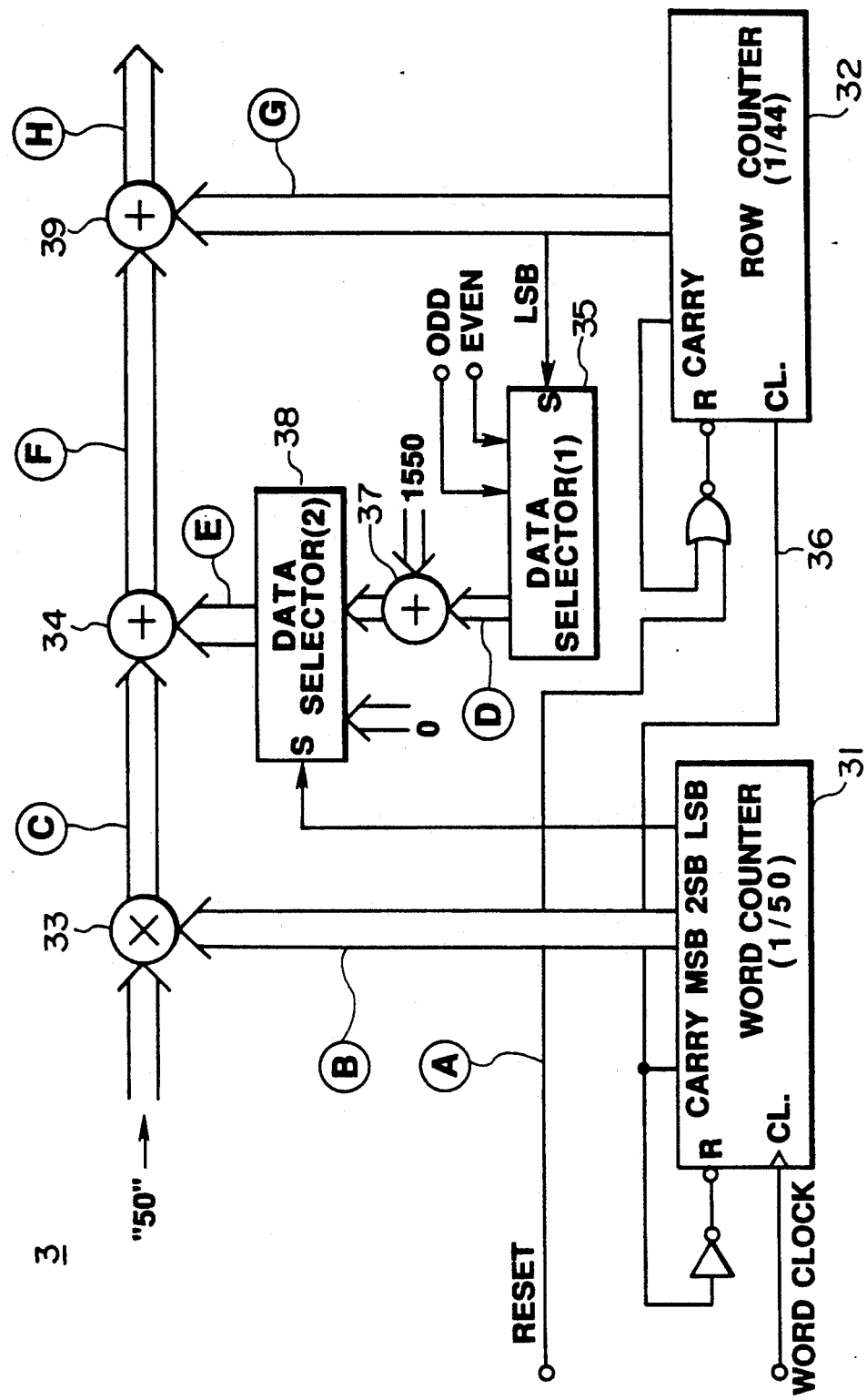
FIG. 6 is a block diagram showing an interleaving address generator.
Figure 7:
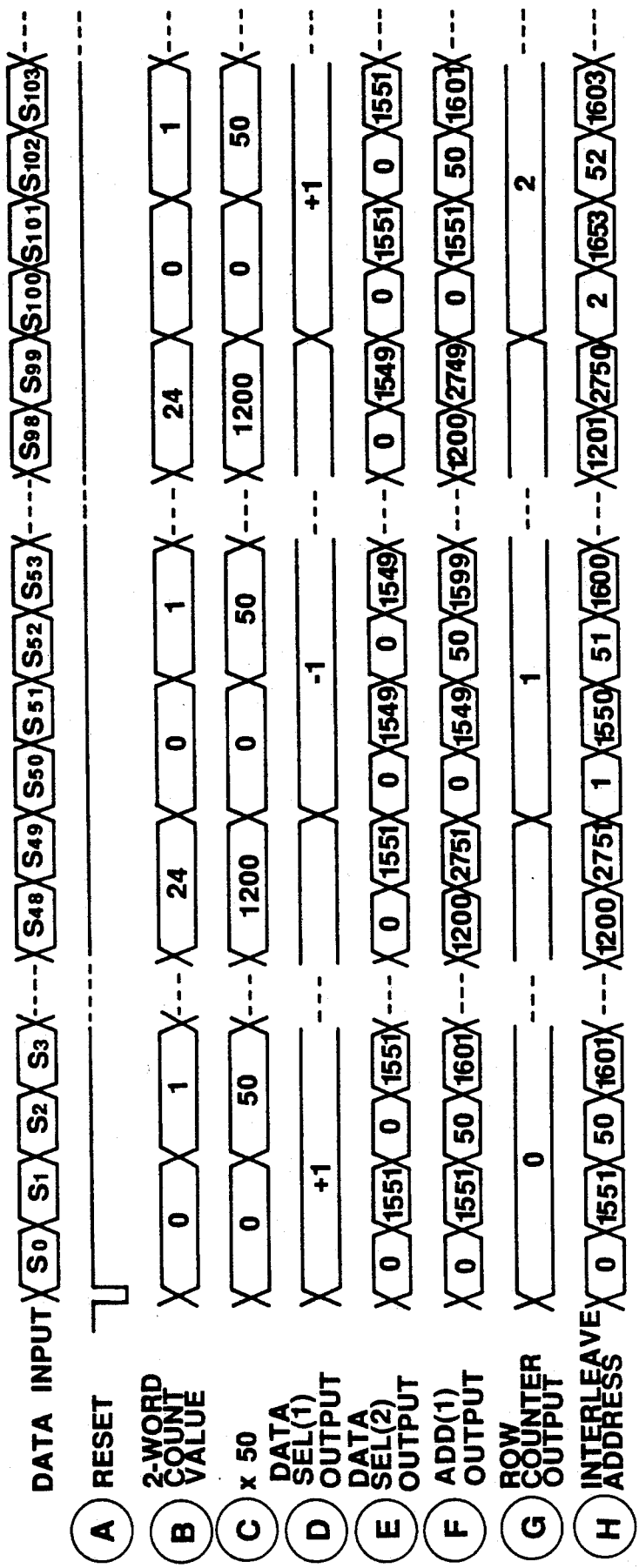
FIG. 7 is a diagrammatic view for illustrating the operation of the interleaving address generator.

The operation of the interleaving address generator 5, the details of which are shown in FIG. 6, will be hereinafter explained with reference to FIG. 7. In FIG. 6, a count value of a 1/50 word counter 31 counting word clocks is input to one input terminal of a multiplier 33, and a numerical value 50 is input to the other input terminal of the multiplier 33. Thus a value equal to 50 times the count value of the counter 31 is supplied to an output of the multiplier 33 and input to a first adder 34. The aforementioned count value is indicated at B and the output value of the multiplier 33 is indicated at C in the time chart of FIG. 7. That is, since the word clocks input to the 1/50 counter 31 are at a frequency equal to the frequency of the input data $S_0$ to $S_n$ shown in the upper row in FIG. 7, and the aforementioned count value represents the output from MSB to LSB of the 1/50 counter, the count value is incremented by 1 at an interval of 2 word clocks, as shown at B in FIG. 7. Thus the count value is output with 0, 1, ..., 24, as one period and the output value C of the multiplier 33 is output with 0, 50, 100, ..., 1200, as one period, as shown at C in FIG. 7.

The word clocks are supplied, after frequency division by 1/50 in the word counter 31, to a row counter 32 over conductor 36. Thus the output signal G of the row counter 32 is incremented by 1 at an interval of 50 word clocks, as shown at G in FIG. 7. The LSB of the output signal G is supplied to an S input terminal of a data selector (1) 35. When the LSB is 0, the output D of the data selector (1) 35 is "+1" as shown at D in FIG. 7 and, when the LSB is 1, the output D of the data selector (1) 35 is "−1". This output D is supplied to one input terminal of the adder 37, while the value 1550 is supplied to the other input terminal of the adder 37. Thus the value $-1+1550=1549$ or the value $+1+1550=1551$ is output from the adder 37 to the data selector (2) 38 depending on whether the value of the output D is −1 or +1, respectively. The value "0" is supplied to one input terminal of the data selector (2) 38, respectively. The value "0" is supplied to one input terminal of the data selector 2 (38) as shown in FIG. 6. The LSB data of the count value of the word counter 31 is supplied to the select terminal S of the data selector (2) 38. The data selector (2) 38 transmits the value "0" or the value "1549" or "1551" to the adder 34 as the data E when the LSB data is "0" or "1", respectively. Thus, as shown in FIGS. 7D and 7E, the value of the data E becomes alternately "0" and "1551" when the data D is "+1", while becoming alternately "0" and "1549" when the data D is "−1". Since the output value F of the adder 34 is equal to the sum of data C plus data E, the data F is changed as shown in FIG. 7F. The data F and the data G are summed at the adder 39. If the result of addition is expressed as data H, the change in state of the value of the data H is 0, 1551, 50, 1601, ..., 1200, 2751, as shown in FIG. 7H. Hence, if this value is used as the address, the continuous digital audio sample data $S_0$, $S_1$, $S_2$, $S_3$, ..., $S_{48}$, ... $S_{99}$ may be stored at addresses 0, 1551, 50, 1601, ..., 1200, ... 2751, respectively.

With the above described data array, there exist no contiguous samples in one and the same row, such that interpolation may be performed effectively even if all the words in a given row are determined to be in error.

In the above described arrangement, since the block frequency or the frame frequency of the digital audio recording format for professional applications are set so as to be at integer ratios with respect to the corresponding frequencies of the CD format, the construction of the clocking system or the interfacing system may be simplified in case in application of a CD mastering system.

The present invention is not limited to the above described embodiment. For example, if the number of bits of the sample data different from the number of bits of the word used as the units for error correction is employed, these numbers of bits may be set freely. In this case, the words making up each sample need not be arrayed vertically, as shown in FIG. 4, but may be arrayed horizontally. The number of interchanged rows may be set in any desired manner. If interchanging is made at an interval of plural rows, a so-called nesting technique may be employed in which the row array in the interchanging unit is changed, for example, the row sequence is rearranged within the 4-row unit of the even-numbered sample region shown in FIG. 4. In addition, the rows may be rearranged in both the even-numbered sample region and the odd-numbered sampel region, provided that the continuous sample data are not present in one and the same row as a result of rearrangement. Although illustrative embodiment of the present invention, and various modifications thereof, have been described in detail herein with reference to the accompanying drawings, it is to be understood that the invention is not limited to these precise embodiments and the described modifications, and that various changes and further modifications may be effected therein by one skilled in the art without departing from the scope or spirit of the invention as defined in the appended claims.

What is claimed is:

1. An apparatus for transmitting digital data samples along with error correction codes comprising:

dividing means for receiving a sequence of said digital data samples and dividing a predetermined number of said digital data samples of said sequence into odd-numbered data samples and even-numbered data samples, arraying means for arraying the odd-numbered and even-numbered data samples as elements of an array, said array having elements arranged in rows and columns and in which no two adjacent digital data samples of said sequence are arrayed as respective elements in the same row, error correction code generating means responsive to a row of said array for generating first parity codes, said error correction code generating means being also responsive to a column of said array for generating second parity codes, said arraying means also arraying said first parity codes as additional elements in additional columns of said array, and said second parity codes as additional elements in additional rows of said array, thereby forming a full matrix, and output means for supplying said elements of said full matrix to an output terminal in an order according to the respective columns and rows of said full matrix in which said elements are arrayed.

2. An apparatus for transmitting digital data samples according to claim 1; wherein said arraying means arrays said even-numbered data samples as adjacent elements in said array, and said odd-numbered data samples as other adjacent elements in said array.

3. An apparatus for transmitting digital data according to claim 2, in which said arraying means arrays said even-numbered data samples, said odd-numbered data samples and said first parity codes so that said even-numbered samples comprise a first group of adjacent columns, said odd-numbered samples comprise a second group of adjacent columns and said first parity codes comprise a third group of adjacent columns, said third group of adjacent columns being adjacent and between said first and second groups in said full matrix.

4. A sampled data transmitting apparatus in which data samples making up a sequence of data samples to be transmitted are arranged as respective elements in a two-dimensional data array having rows and columns, and in which error correction code data are annexed to each row and to each column of said two-dimensional data array, said apparatus comprising:

an interleaving memory having addressed locations for storing said data samples and said error correction code data at respective addressed locations in accordance with respective storage addresses and for reading out said data samples and said error correction code data from said respective addressed locations in accordance with respective read addresses, interleaving address generating means for generating and supplying storage addresses to said interleaving memory so that no two adjacent data samples of said sequence are stored in respective addressed locations corresponding to the same row of said two-dimensional data array, error correction code computing means for computing error correction code data for the rows and columns of said two-dimensional data array stored in said interleaving memory, and for supplying said error correction code data to said interleaving memory for storage therein, said interleaving address generating means also generating and supplying storage addresses for said error correction code data to said interleaving memory, and output address generating means for generating and supplying read addresses to said interleaving memory so that the data samples and the error correction code data are read out from the respective addressed locations corresponding to said read addresses in an order according to the columns and rows of said two-dimensional data array.

5. An apparatus according to claim 4; further including dividing means for dividing said data samples into odd-numbered data samples and even-numbered data samples, and wherein said interleaving address generating means generates storage addresses so that said even-numbered data samples are stored in addressed locations corresponding to a first group of adjacent columns of said two-dimensional data array and said odd-numbered data samples are stored in addressed locations corresponding to a second group of adjacent columns of said two-dimensional array.

6. An apparatus for transmitting digital data samples along with error correction codes comprising:

dividing means for receiving a sequence of said digital data samples and dividing subsequences comprising a predetermined number of at least four of said digital data samples of said sequence into odd-numbered data samples and even-numbered data samples, arraying means for arraying the odd-numbered and even-numbered data samples as elements of an array, said array having elements arranged in rows and columns and in which all even-numbered elements of a subsequence are arrayed as respective elements in the same row, and all odd-numbered elements of said subsequence are arrayed as respective elements in a different row, error correction code generating means respective to a row of said array for generating first parity codes, said error correction code generating means being also responsive to a column of said array for generating second parity codes, said arraying means also arraying said first parity codes as additional elements in additional columns of said array, and said second parity codes as additional elements in additional rows of said array, thereby forming a full matrix, and output means for supplying said elements of said full matrix to an output terminal in an order according to the respective columns and rows of said full matrix in which said elements are arrayed.

* * * * *